United States Patent [19]
Norman et al.

[11] Patent Number: 5,821,773
[45] Date of Patent: Oct. 13, 1998

[54] LOOK-UP TABLE BASED LOGIC ELEMENT WITH COMPLETE PERMUTABILITY OF THE INPUTS TO THE SECONDARY SIGNALS

[75] Inventors: Kevin A. Norman, Belmont; Rakesh H. Patel, Cupertino; Stephen P. Sample, Saratoga, all of Calif.; Michael R. Butts, Beaverton, Oreg.

[73] Assignees: Altera Corporation, San Jose; Quickturn Design Systems, Inc., Mountain View, both of Calif.

[21] Appl. No.: 524,698

[22] Filed: Sep. 6, 1995

[51] Int. Cl.[6] .............................. H03K 7/38; H03K 19/00
[52] U.S. Cl. .................................. 326/39; 326/40; 326/16
[58] Field of Search ................................. 326/16, 39, 40; 371/22.1, 22.3

[56] References Cited

U.S. PATENT DOCUMENTS

| | | |
|---|---|---|
| Re. 34,363 | 8/1993 | Freeman . |
| 3,473,160 | 10/1969 | Wahlstrom ........................... 340/172.5 |
| 3,761,695 | 9/1973 | Eichelberger . |
| 3,783,254 | 1/1974 | Eichelberger . |
| 3,806,891 | 4/1974 | Eichelberger et al. . |
| 4,020,469 | 4/1977 | Manning ................................ 340/172 |
| 4,124,899 | 11/1978 | Birkner ................................... 364/716 |
| 4,286,173 | 8/1981 | Oka et al. . |
| 4,293,919 | 10/1981 | Dasgupta et al. . |
| 4,298,980 | 11/1981 | Hajdu et al. . |
| 4,366,393 | 12/1982 | Kasuya . |
| 4,428,060 | 1/1984 | Blum . |
| 4,476,560 | 10/1984 | Miller et al. . |
| 4,488,259 | 12/1984 | Mercy . |
| 4,546,273 | 10/1985 | Osman . |
| 4,597,042 | 6/1986 | d'Angeac et al. . |
| 4,609,986 | 9/1986 | Hartmann et al. ....................... 364/200 |
| 4,617,479 | 10/1986 | Hartmann et al. . |
| 4,642,487 | 2/1987 | Carter . |
| 4,649,539 | 3/1987 | Crain et al. . |
| 4,667,325 | 5/1987 | Kitano et al. . |
| 4,677,318 | 6/1987 | Veenstra et al. . |
| 4,701,920 | 10/1987 | Resnick et al. . |
| 4,706,216 | 11/1987 | Carter ........................................ 365/94 |

(List continued on next page.)

OTHER PUBLICATIONS

Minnick: "Survey of Microcellular Research", Journal of ACM, Apr. 1967.
Nichols: "A Logical Next Step For Read–Only Memories", Electronics, Jun. 1967.
Shoup: "Programmable Cellular Logic Arrays", Carnegie Mellon Ph.D thesis, Mar. 1970.
Fleisher: "the Writeable Personalized Chip" Computer Design, Jun. 1970.
Mukhopadhyay: "Recent Developments in Switching Theory", Academic Press, 1970.
Heutink: "Implications of Busing For Cellular Arrays", Computer Design, Nov. 1974.
Wahlstrom: "Programmable Logic Arrays–Cheaper By The Millions", Electronics, Dec. 1967.
Xilinx Programmable Logic Data Book, chapter entitled "XC4000, XC4000A, XC4000H Logic Cell Array Families", 1994, Revised Apr. 1995, pp. 2–7 to 2–46.
"IEEE Standard Test Access Port and Boundary–Scan Architecture," Std 1149–1–1990 (Includes IEEE Std 1149.1a–1993), IEEE Computer Society, Oct. 21, 1993, 174 pages.

(List continued on next page.)

*Primary Examiner*—Michael J. Tokar
*Assistant Examiner*—Richard Roseen
*Attorney, Agent, or Firm*—Townsend and Townsend and Crew LLP

[57] ABSTRACT

A logic element for a programmable logic device. The logic element includes a look-up table (400) for implementing logical functions, a programmable delay block (415), a storage block (430) configurable as a latch or a flip-flop, and a diagnostic shadow latch (435). A plurality of inputs (410) to the logic element and complements of these inputs are available to control the secondary functions of the storage block (430).

32 Claims, 4 Drawing Sheets

U.S. PATENT DOCUMENTS

| | | | |
|---|---|---|---|
| 4,713,792 | 12/1987 | Hartmann et al. | 364/900 |
| 4,717,912 | 1/1988 | Harvey | 340/825.8 |
| 4,871,930 | 10/1989 | Wong et al. . | |
| 4,899,067 | 2/1990 | So et al. . | |
| 4,912,342 | 3/1990 | Wong et al. . | |
| 5,036,473 | 7/1991 | Butts | 364/489 |
| 5,109,353 | 4/1992 | Sample et al. . | |
| 5,121,006 | 6/1992 | Pedersen et al. . | |
| 5,175,859 | 12/1992 | Miller et al. . | |
| 5,241,224 | 8/1993 | Pedersen et al. . | |
| 5,260,610 | 11/1993 | Pedersen et al. . | |
| 5,260,611 | 11/1993 | Cliff et al. . | |
| 5,317,212 | 5/1994 | Wahlstrom . | |
| 5,329,470 | 7/1994 | Sample et al. . | |
| 5,336,950 | 8/1994 | Popli et al. . | |
| 5,350,954 | 9/1994 | Patel et al. . | |
| 5,352,123 | 10/1994 | Sample et al. . | |
| 5,355,369 | 10/1994 | Greenberger et al. . | |
| 5,375,086 | 12/1994 | Wahlstrom | 365/149 |
| 5,392,296 | 2/1995 | Suzuki . | |
| 5,414,377 | 5/1995 | Freidin | 326/40 |
| 5,436,575 | 7/1995 | Pedersen et al. | 326/40 |
| 5,452,239 | 9/1995 | Dai et al. . | |
| 5,477,475 | 12/1995 | Sample et al. . | |
| 5,488,316 | 1/1996 | Freeman et al. | 326/39 |
| 5,550,782 | 8/1996 | Cliff et al. | 326/40 |
| 5,612,891 | 3/1997 | Butts et al. . | |
| 5,644,515 | 7/1997 | Sample et al. . | |
| 5,657,241 | 8/1997 | Butts et al. . | |
| 5,661,662 | 8/1997 | Butts et al. . | |
| B1 4,617,479 | 9/1993 | Hartmann et al. . | |

OTHER PUBLICATIONS

"Supplement to IEEE Std 1149.1–1990, IEEE Standard Test Access Port and Boundary–Scan Architecture," Std 1149.1b–1994 (Supplement to IEEE Std 1149.1–1990 and IEEE Std 1149.1a–1993), IEEE Computer Society, Mar. 1, 1995, 78 pages.

Altera 1995 Data Book, Product Index, Introduction, and "Max 9000 Programable Logic Device Family," Mar. 1995, ver. 3, pp. 117–152.

Altera, "JTAG Boundary–Scan Testing In Altera Devices," Altera Corporation, 1996, pp. 1–28.

Morales, Xilinx Application Note "Boundary Scan in XC4000 Devices," XAPP 017.002, pp. 8–45 to 8–59.

LOOK-UP TABLE BASED LOGIC ELEMENT WITH COMPLETE PERMUTABILITY OF THE INPUTS TO THE SECONDARY SIGNALS

BACKGROUND OF THE INVENTION

The present invention relates to the field of programmable logic integrated circuits. More specifically, the present invention provides an enhanced programmable logic architecture, improving upon the composition, configuration, and arrangements of logic array blocks (LABs) and logic elements (LEs) and also the interconnections between these logic array blocks and logic elements.

Programmable Logic Devices (PLDs) are well known to those in the electronic art. Such programmable logic devices are commonly referred as PALs (Programmable Array Logic), PLAs (Programmable Logic Arrays), FPLAs (Field Programmable Logic Arrays), PLDs (Programmable Logic Devices), EPLDs (Erasable Programmable Logic Devices), EEPLDs (Electrically Erasable Programmable Logic Devices), LCAs (Logic Cell Arrays), FPGAs (Field Programmable Gate Arrays), and the like. Such devices are used in a wide array of applications where it is desirable to program standard, off-the-shelf devices for a specific application. Such devices include, for example, the well-known, Classic™, and MAX® 5000, and FLEX® 8000 EPLDs made by Altera Corp.

PLDs are generally known in which many LABs are provided in a two-dimensional array. Further, PLDs have an array of intersecting signal conductors for programmably selecting and conducting logic signals to, from, and between the LABs. LABs contain a number of individual programmable logic elements (LEs) which provide relatively elementary logic functions such as NAND, NOR, and exclusive OR.

Resulting from the continued scaling and shrinking of semiconductor device geometries which are used to form integrated circuits (also known as "chips"), integrated circuits have progressively become smaller and denser. For programmable logic, it becomes possible to put greater numbers of programmable logic elements onto one integrated circuit. Furthermore, as the number of elements increases, it becomes increasingly important to improve the techniques and architectures used for interconnecting the elements and routing signals between the logic blocks.

While such devices have met with substantial success, such devices also meet with certain limitations, especially in situations in which the provision of more complex logic modules and additional or alternative types of interconnections between the logic modules would have benefits sufficient to justify the additional circuitry and programming complexity. There is also a continuing demand for logic devices with larger capacity. This produces a need to implement logic functions more efficiently and to make better use of the portion of the device which is devoted to interconnecting individual logic modules.

As can be seen, an improved programmable logic device architecture is needed, especially a programmable logic element which improves the organization of logic modules and interconnection resources within the logic element.

SUMMARY OF THE INVENTION

The present invention is a programmable logic element which facilitates the implementation of logical functions in a programmable logic device. The present invention includes a programmable, multi-input look-up table which can generate desired logical functions. The present invention further includes a storage block which can store data from the look-up table. Furthermore, the storage block is configurable to operate as a level-sensitive latch or an edge-triggered register. The storage block includes clock, clock enable, clear, and preset inputs for controlling these functions of the storage block. One or more of the inputs to the look-up table and optionally, their complements may be programmably selected to control the clock, clock enable, clear, and preset inputs. The logic element is configurable for either combinatorial or registered output.

The logic element may be coupled to a secondary logic block providing specialized logic functions. The secondary logic block may selectively take input from one or more of the four inputs to the look-up table (or their complements), as well as the output of the look-up table. Output from the secondary logic block is selectively passed through the registered output path of the logic element. The logic element also includes a diagnostic shadow latch used for prototyping and debugging new programmable logic designs.

More specifically, in accordance with the teachings of this invention, a logic element for a programmable logic device is disclosed, which includes a look-up table for implementing logical functions; a storage block coupled to the look-up table, where the storage block stores an output from the look-up table and is programmably configurable as a latch in a first mode, where the latch is responsive to a level-sensitive clock input, and where the storage block is programmably configurable as a register in a second mode, where the register is responsive to an edge-triggered clock input. The register may be further responsive to a clock enable input. Furthermore, the logic element has a combinatorial output, coupled to the look-up table, and a registered output, coupled to the storage block.

In further embodiments of the present invention, the logic element includes a programmable delay block, coupled between the look-up table and the storage block, where this programmable delay block is for programmably delaying a signal passed from the look-up table to the storage block.

In another embodiment, the logic element includes a first plurality of input lines, coupled to the look-up table and the storage block, where this first plurality of input lines is for conducting a plurality of logic signals; and a second plurality of input lines, coupled to the storage block, where this second plurality of input lines is for conducting complements of the plurality of logic signals.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
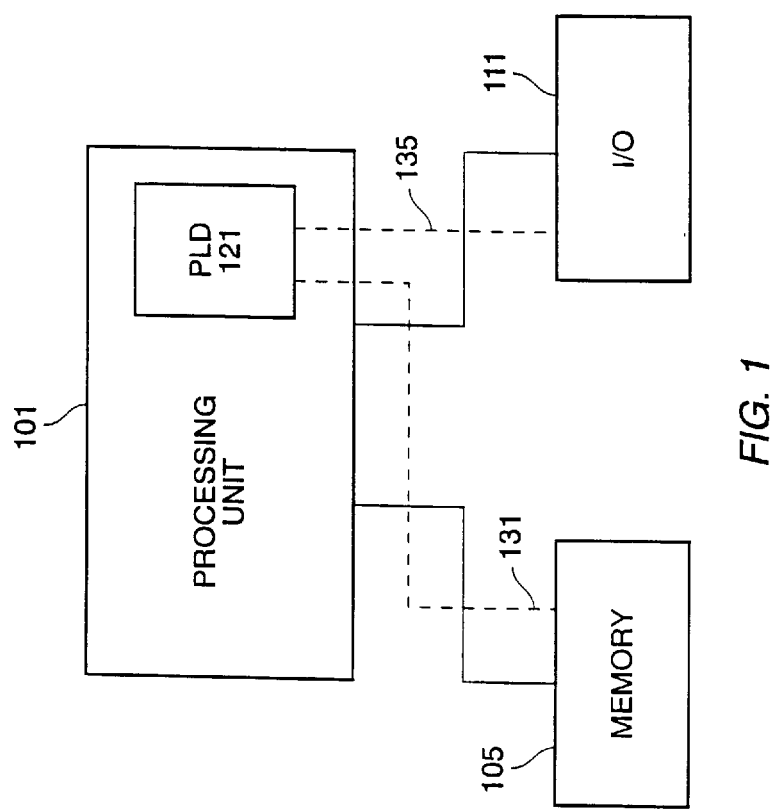
FIG. 1 is a block diagram of a digital system incorporating a programmable logic device integrated circuit.

FIG. 1 shows a block diagram of a digital system within which the present invention may be embodied. In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD may serve many different purposes within the system in FIG. 1. PLD 121 may be a logical building block of processing unit 101, supporting its internal and external operations. PLD 121 is programmed to implement the logical functions necessary to carry on its particular role in system operation.

As some examples of the multitude of uses for PLD 121, processing unit 101 may use PLD 121, through connection 131, to decode memory or port addresses for accessing memory 105 or I/O 111. PLD 121 may be programmed to store data like a memory or specialized memory, where this comes from processing unit 101 or memory 105 (via connection 131). PLD 121 may be used as a microcontroller for a memory 105 device such as a fixed or flexible disk drive. PLD 121 may also be configured to be a microcontroller for an I/O 111 device such as a keyboard or scanner, passing data through connection 135.

In other embodiments, PLD 121 may be used as a controller or specialized processing unit such as a coprocessor for performing mathematical or graphical calculations. In still other embodiments, PLD 121 may be used for telecommunications applications. For example, processing unit 101 would direct data to PLD 121; PLD 121 processes this data; then PLD 121 returns the results to processing unit 101. Furthermore, processing unit 101 may pass or direct a program stored in memory 105 or input using I/O 111 to PLD 121 for execution. These are some of multitude of uses of PLD 121 within a digital system. Also, a system such as the one shown in FIG. 1 may embody a plurality of PLDs 121, each performing different system functions.

The system shown in FIG. 1 may also be used for programming PLD 121 with a particular logic pattern. A computer program for designing functions into a PLD may be stored in memory 105 and executed using processing unit 101. Then, a design characteristic which is to be programmed into PLD 121 is input via I/O 111 and processed by processing unit 101. In the end, processing unit 101 transfers and programs the design characteristic into PLD 121.

In FIG. 1, processing unit 101 is shown incorporating PLD 121. However, in other embodiments, PLD 121 may be external to processing unit 101, and a PLD interface may be coupled between processing unit 101 and PLD 121. The PLD interface would provide the proper adapters or sockets for interfacing PLD 121 to processing unit 101. Moreover, the PLD interface would provide the proper voltages and electrical characteristics for coupling PLD 121 to processing unit 101.

Figure 2:
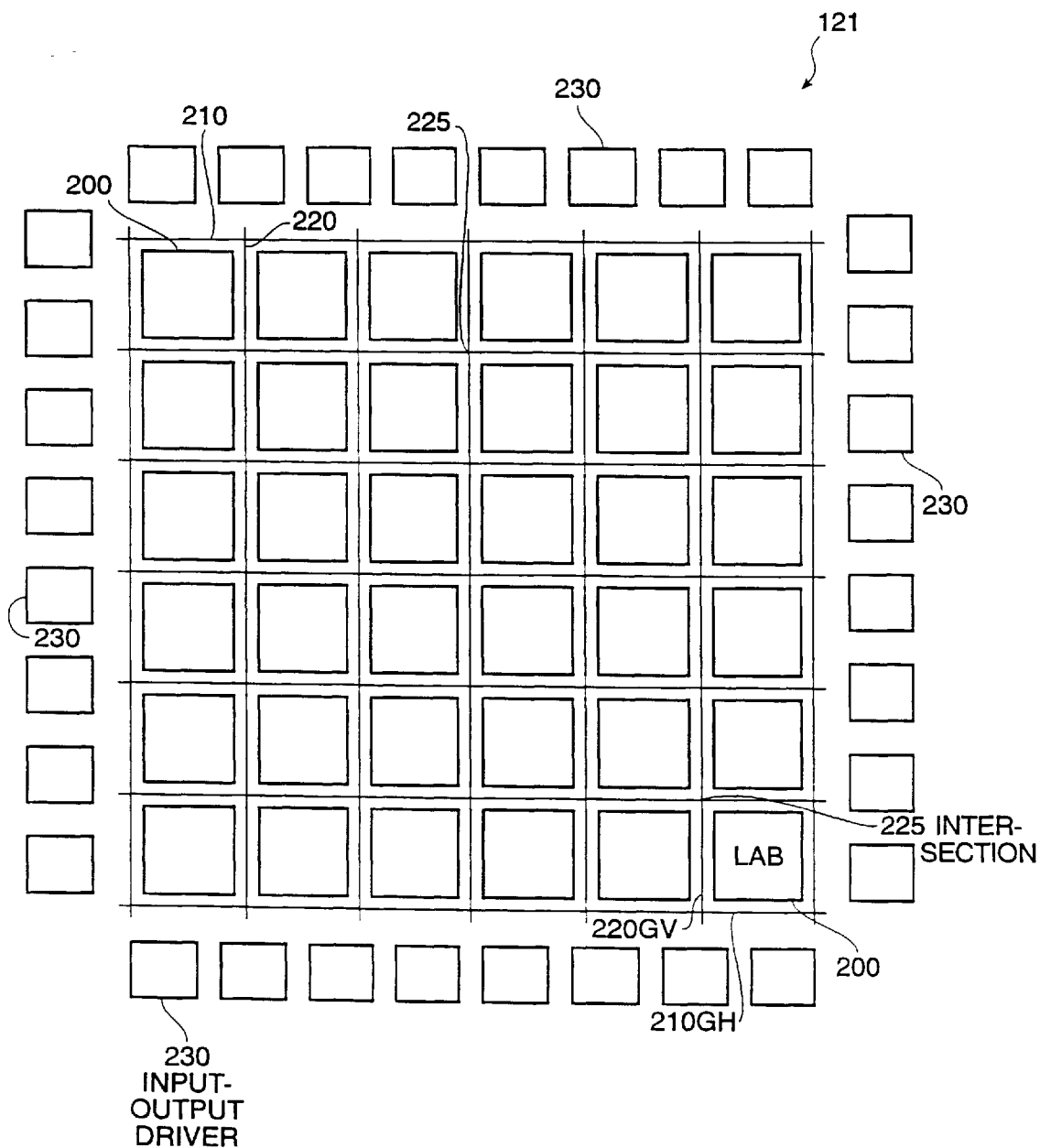
FIG. 2 is a block diagram showing the overall architecture of a programmable logic device.

FIG. 2 is a simplified block diagram of the overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than the PLD 121 shown in FIG. 2. Some PLDs may even contain a single LAB. However, generally in the future, as technology advances and improves, programmable logic devices with even greater numbers of logic array blocks will undoubtedly be created.

Furthermore, LABs 200 need not be organized in a square or rectangular matrix. While a rectangular or square array is generally an efficient layout structure, any arrangement of LABs inside the PLD may be conceived. For example, the array may be organized in a five-by-seven or a twenty-by-seventy matrix of LABs. Furthermore, in some circumstances, some number of LABs may be replaced by different programmable structures.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line represents a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Also, in some embodiments, intersection 225 may have programmable drivers for selecting the signal from a conductor in one direction and buffer the signal and drive it onto one of the alternate conductors in the same or different direction. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. Furthermore, an output signal from one LAB 200 can be directed into the inputs of one or more LABs 200. Also, using the global interconnect, signals from a LAB 200 can be fed back into the same LAB 200. In other embodiments or the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The global interconnect may contain long and segmented conductors. Long conductors run the entire length or width of PLD 121. In particular, long conductors may programmably couple LABs along a length or width of PLD 121. Segmented conductors are for shorter length interconnections. For example, segmented conductors may include double lines for interconnections between two LABs 200. Other segmented conductors include, among other, triple lines, quadruple lines, quintuple lines, sextuple lines, and other similar interconnection resources. Furthermore, at intersections 225, segmented conductors may be programmably coupled (or programmably uncoupled) to other long or segmented conductors, in the same or different direction. Intersection 225 may sometimes be referred to as a "switch box." As an example, a double line may be programmably coupled to other double, long, or segmented lines, in the same or different direction, at intersections 225.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

An input driver buffers a signal received on a external pin and drives this signal onto one of the conductors inside the integrated circuit; then, this signal may be coupled to the desired internal circuits and LABs 200. An output driver buffers a signal received on an internal conductor, such as GHs 210 and GVs 220, to drive the signal out onto the external pin of the device. This makes the signal available to the "outside world."

An output driver may have additional characteristics. Among these are "tristate," "open drain," and "open source" features. A tristateable output driver may be enabled and disabled by a control signal. When enabled, a tristate output driver drives a data signal onto the external pin with a low impedance. When disabled, this output buffer does not drive the data signal out to the external pin, but the output buffer assumes a high-impedance state. In the high-impedance state, the tristate output driver has no effect on the signal level of the external pin. A tristateable output buffer may be used for a bidirectional input-output bus. An open-drain output driver behaves as follows: When the input data is a logic high, the output buffer assumes a high impedance state. When the input data input is a logic low, the output buffer drives out a logic low at low impedance. An open-source output driver behaves similarly: When the input data is a logic high, the buffer drives the external pin to a logic high at low impedance. When the input data is a logic low, the buffer assumes a high-impedance state.

An external pin may be coupled to both an input buffer and an output buffer. This type of pin is sometimes referred to as an input-output pin. In other embodiments of the present invention, a PLD may have dedicated input drivers and dedicated output driver, as well as special "fast" input drivers and the like.

Like LABs 200, input-output drivers 230 are programmably connectable to adjacent GH 210 and GV 220 conductors. Using GH 210 and GV 220 conductors, input-output drivers 230 are programmably connectable to any LAB 200. Input-output drivers 230 facilitate the transfer of data between LABs 200 and external, off-chip circuitry. For example, off-chip logic signals from other chips may be coupled through input-output drivers 230 to drive one or more LABs 200. Based on these off-chip inputs and the logical functions programmed into LABs 200, LABs 200 will generate output signals that are coupled through the global interconnect to input-output drivers 230 for interfacing with off-chip circuitry.

Figure 3A:
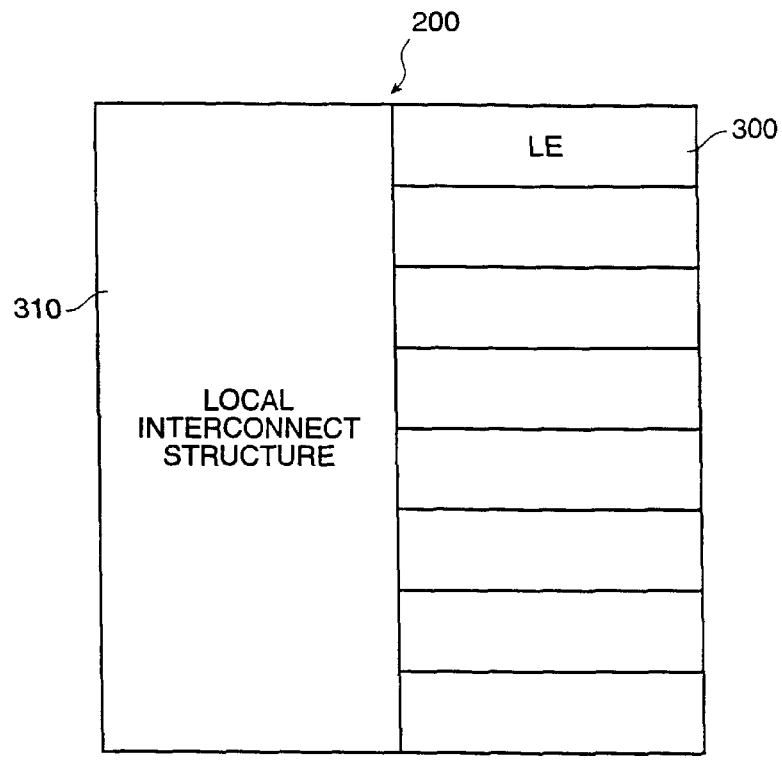
FIG. 3A is a simplified block diagram of a logic array block (LAB) of a programmable logic device.

FIG. 3A shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight. In a further embodiment of the present invention, LAB 200 has two "banks" of eight LEs for a total of sixteen LEs, where each bank has common inputs, but separate outputs and control signals. In some embodiments, LAB 200 includes carry chains.

A more detailed description of LE 300 of the present invention is given below in connection with FIG. 4. A general overview is presented here, sufficient to provide a basic understanding of LAB 200. LE 300 is the smallest logical building block of a PLD. Signals external to the LAB, such as from GHs 210 and GVs 220, are programmably connected to LE 300 through local interconnect structure 310, although LE 300 may be implemented in many architectures other than those shown in FIGS. 1–3. In one embodiment, LE 300 of the present invention incorporates a function generator that is configurable to provide a logical function of a number of variables, such a four-variable boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220. Through local interconnect structure 310 and local feedback, LEs 300 are programmably connectable to form larger, more complex logical functions than can be realized using a single LE 300. Furthermore, because of its reduced size and shorter length, local interconnect structure 310 has reduced parasitics compared to the global interconnection structure. Consequently, local interconnect structure 310 generally allows signals to propagate faster than through the global interconnect structure.

Figure 3B:
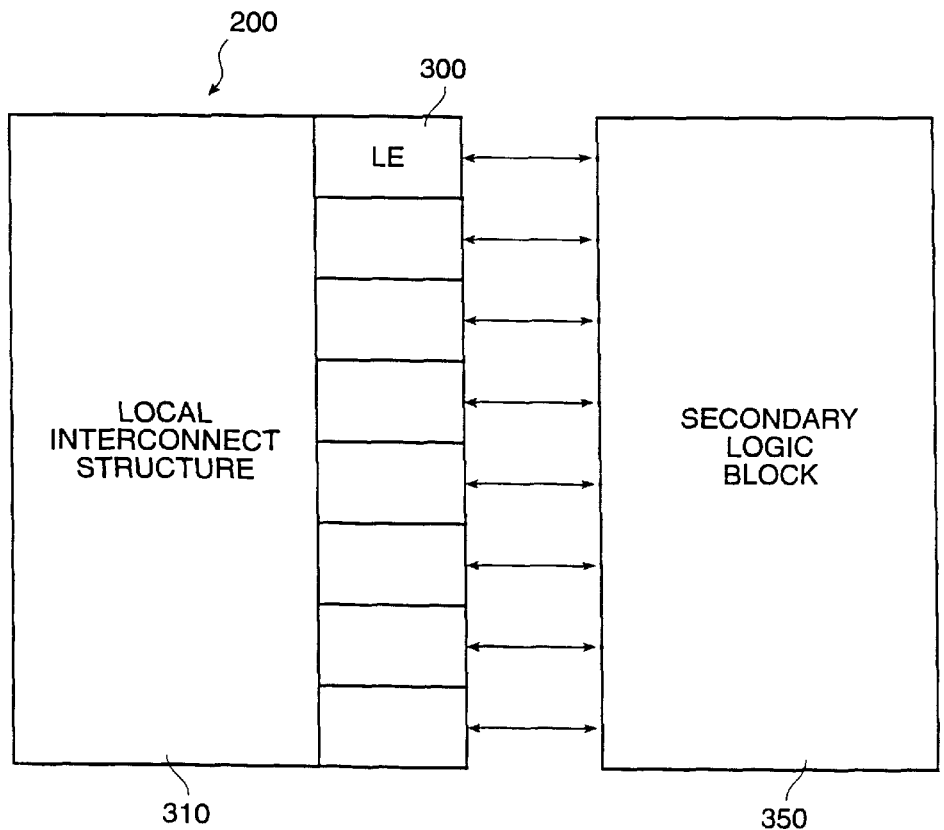
FIG. 3B shows a LAB interfacing with a secondary logic block.

FIG. 3B shows LAB 200 and LEs 300 interfacing with a secondary or auxiliary logic block 350. Secondary logic block 350 provides additional functionality for LAB 200 and LEs 300. Secondary logic block 350 contains specialized logical functionality such as a memory, an arithmetic accelerator, a wide multiplexer, or a other similar logic components, and combinations of these. Data is passed to and from LEs 300 of LAB 200 and secondary logic block 350. For example, signals and data may be passed to secondary logic block 350, processed by secondary logic block 350, and then the results returned to LAB 200 and LEs 300. PLD 121 may contain multiple secondary logic blocks 350, all of which need not provide the same logic function. For example, one secondary logic block 350 may be an arithmetic accelerator while another is a memory.

As shown in the embodiment of FIG. 3B, multiple LEs 300 within LAB 200 may be programmably coupled to one secondary logic block 350. In further embodiments, there many be any number of LEs 300 or LABs 200 programmably coupled to secondary logic block 350. For example, there may be one secondary logic block 350 for one LE 300 or one secondary logic block 350 shared by a plurality of LABs 200. Also, only a portion of the LEs 300 of LAB 200 may be programmable coupled to one secondary logic block 350, while the others are coupled to another. Further description of the interface between LE 300 and secondary logic block 350 is given below in FIG. 4.

Figure 4:
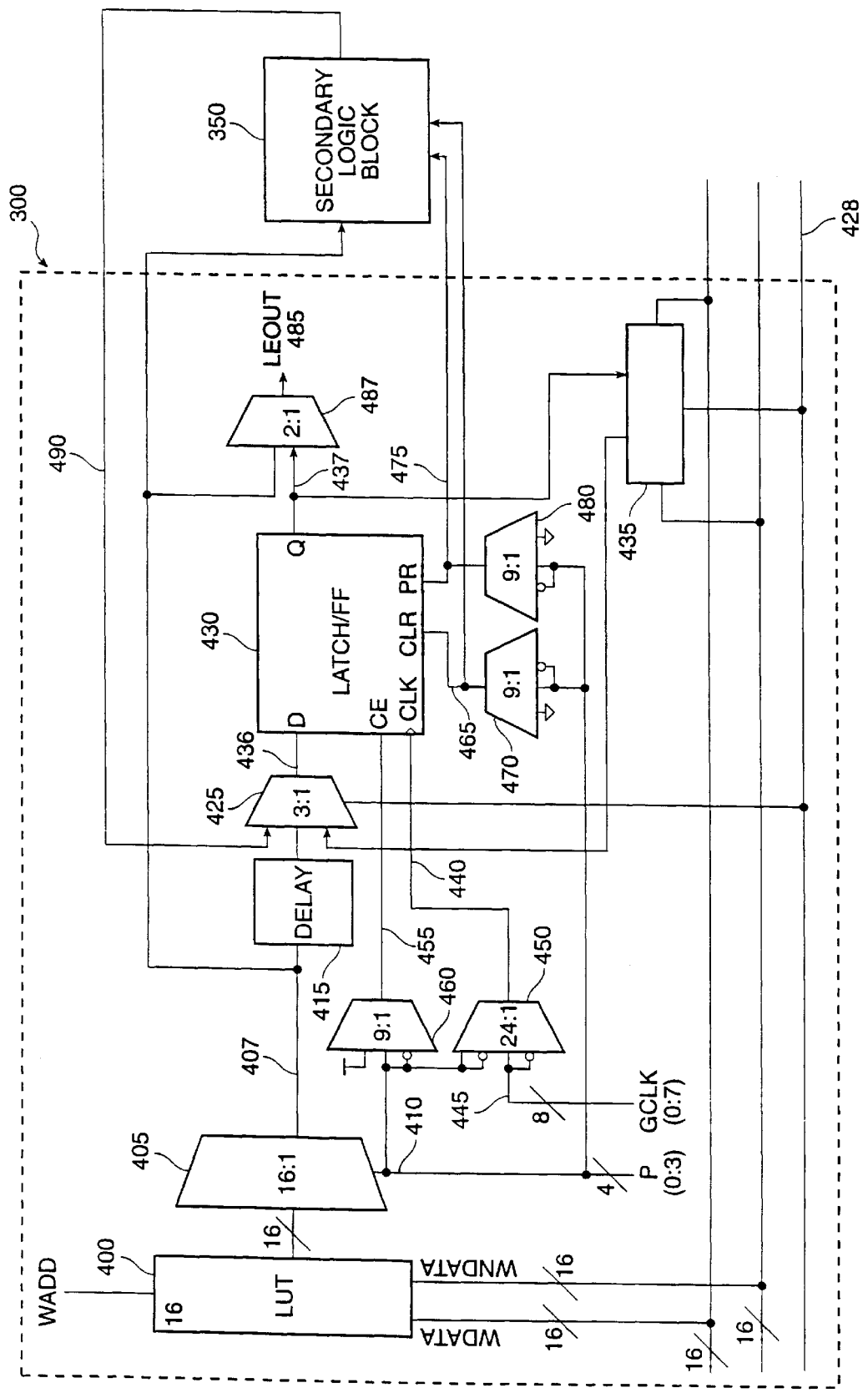
FIG. 4 is a block diagram a LE of the present invention, where the LE is shown interfacing to a secondary logic block.

FIG. 4 is a more detailed diagram of LE 300 of FIG. 3, shown interfacing with secondary logic block 350. LUT 400 is the programmable function generator in LE 300 described above that quickly computes a function of the variable inputs. In this particular embodiment, LUT 400 is a four-input look-up table that is configurable to produce the sixteen possible logical outputs for a boolean operation of four variables. In other embodiments, LUT 400 may have any number of variable inputs. Instead of a look-up table, LUT 400 may be designed using other programmable systems for performing and/or functionality such as logic gates, flip-flops, multiplexers, and programmable AND-OR arrays.

In a preferred embodiment, LUT 400 is implemented using a random access memory (RAM). More specifically, LUT 400 is implemented using a 16-bit RAM, in one specific embodiment, each bit storing an output state corresponding to one of, e.g., sixteen possible input combinations. In further embodiments of the present invention, LUT 400 may be implemented using other types of memories besides a RAM, such as first-in, first-out (FIFO) memory.

LUT 400 may be constructed using many different fabrication technologies including fuse, antifuse, ferromagnetic core, erasable programmable read-only memory (EPROM), and electrically erasable programmable read-only memory (EEPROM) technology, or any combination of these. LUT 400 may also be constructed from dynamic random access memory (DRAM) or static random access memory (SRAM) technology. In a preferred embodiment of the present invention, LUT 400 uses SRAM memory.

LUT 400 is configured, or programmed, using a WDATA line and a WNDATA line, to provide the desired logical function. WDATA contains sixteen conductors and WNDATA also contains sixteen conductors. WDATA and WNDATA are used to transfer the sixteen bits of data to be programmed into the sixteen RAM cells of LUT 400. The signals in WNDATA are the complements of WDATA. WDATA and WNDATA convey a differential signal from configuration registers (containing configuration data) at another location on PLD 121 to the individual bits in LUT 400. A WADD signal is used to strobe the configuration data on the WDATA line or WNDATA line into LUT 400. The configuration data may be strobed into LUT 400 in parallel.

The sixteen RAM cells of LUT 400 feed into the inputs of a sixteen-to-one multiplexer 405. An output 407 of multiplexer 405 is selected from among these sixteen inputs from LUT 400. Primary inputs 410, comprising four input signals, P0, P1, P2, and P3, feed into the selection inputs of multiplexer 405. The four primary inputs 410 direct multiplexer 405 to select one of the sixteen RAM cells of LUT 400 for output. Primary inputs 410 represent the four input variables used for generating a four-variable logical function using LUT 400. In operation, primary inputs 410 are the boolean inputs used to select (via multiplexer 405) a particular entry from LUT 400 for output using multiplexer 405. Consequently, depending on the "truth table" programmed into LUT 400, a logical function having up to four variables can be implemented.

Output 407 of multiplexer 405 is coupled to an input of programmable delay block 415. The output of programmable delay block 415 is coupled to three-to-one multiplexer 425, which outputs to a storage block 430. Programmable delay block 415 passes a signal from its input to an output with a specific, but variable amount of delay. The amount of delay is determined by programming the programmable delay block 415. In one embodiment, programmable delay block 415 is programmable to pass a signal with either no delay or a fixed amount delay. Specifically, programmable delay block 415 is programmable to provide either a zero nanoseconds delay or a twenty-five nanoseconds delay determined by the state of a programmable bit. For example, if the programmable bit is programmed, programmable logic block 415 provides a twenty-five nanoseconds delay; if this programmable bit is not programmed, programmable logic block 415 provides a zero nanoseconds delay.

In other embodiments of the present invention, programmable delay block 415 provides a variable delay based upon a programmed value. For example, programmable delay block 415 may be programmed with a value of a discrete set of values between zero nanoseconds and one hundred nanoseconds to provide this amount of delay. Programmable delay block 415 is useful for the correction of system timing problems, specifically, hold time violations at the input of a register or flip-flop, such as storage block 430. Furthermore, programmable delay block 415 is useful for correcting timing skew problems.

The output of programmable delay block 415 is connected to three-to-one multiplexer 425. Multiplexer 425 connects one of its three inputs to an input 426 of a storage block 430. A first input to multiplexer 425 comes from secondary logic block 350; a second input comes from programmable delay block 415; and a third input comes from a diagnostic shadow latch 435 (described below). Control signal 428 is the selection control for multiplexer 425. Based on the state of control signal 428, multiplexer 425 is configured statically to direct the output of delay block 415 or an output of secondary logic block 350. The third input is dynamically substituted for the configured input to storage block 430 when a diagnostic loading of the storage block's state is performed. One of these three inputs, selected by control signal 428, is connected to an input 436 of storage block 430.

Storage block 430 is used to store data from any of these three sources. Storage block 430 is programmably configurable as a latch or a D flip-flop and used for sequential or registered logical functions. Storage block 430 passes its output Q to an output 437. Storage block 430 stores and outputs data in response to a signal at a clock input 440. When configured as a latch, storage block 430 will store and output data responsive to a level-sensitive signal at clock input 440. When storage block 430 is configured as a D flip-flop, storage block 430 will store and output data responsive to an edge-triggered clock at clock input 440. A clock enable function of storage block 430 will be described below.

Clock input 440 can come from one of a plurality of inputs. In one embodiment, twenty-four different sources may be used as the clock input. The clock input is programmably selected using a twenty-four-to-one multiplexer 450. There are eight global clock inputs 445, GCLK0, GCLK1, GCLK2, GCLK3, GCLK4, GCLK5, GCLK6, and GCLK7, which are input into a twenty-four-to-one multiplexer 450. Furthermore, the complements of these eight global clock signals 445 are also inputs for multiplexer 450. The four primary inputs 410 and the complements of the four primary inputs 410 are also inputs for multiplexer 450. These twenty-four signals constitute the inputs to multiplexer 450; one of these signals may be programmably selected using multiplexer 450 to control clock input 440 of storage block 430.

Storage block 430 has a clock enable function, which is controlled by a clock enable (CE) signal 455. CE 455 enables or disables clocking or latching of storage block 430. When CE 455 is a high, storage block 430 may be clocked to store data. When CE 455 is a low, clocking of storage block 430 is disabled. More specifically, if CE 455 is low at the time of a rising edge of the clock, storage block 430 retains its current state and does not store the data at its input 436. If CE 455 is a high at the time of a rising edge of the clock, then storage block 430 does clock-in and store the data at its input 436. In one embodiment, clock enable does not impact the operation of storage block 430 in latch mode.

CE 455 may be programmably selected from nine different signals using a nine-to-one multiplexer 460. CE 455 may be programmably connected to VCC which will permanently enable clocking of storage block 430. Furthermore, CE 455 may be programmably connected to one of the four primary inputs 410 or the complements of the four primary inputs 410. One of these nine signals may be programmably selected using multiplexer 460 to control the CE 455 input of storage block 430.

The multiplexers 450 and 460 are controlled by way of user-programmable SRAM bits (not shown). Depending upon the state of such user-programmed bits, appropriate clock and clock enable inputs are selected.

Storage block 430 has a clear function which clears the stored contents of storage block 430 to a low or "zero." This function is controlled by a clear (CLR) signal 465. CLR 455 may be programmably selected from nine different signals using a nine-to-one multiplexer 470, also controlled by user-programmable SRAM bits. CLR 455 may be programmably connected to ground or VSS to permanently disable the clear feature of storage block 430. Furthermore, CLR 465 may be programmably connected to one of the four primary inputs 410 or the complements of the four primary inputs 410. One of these nine signals may be programmably selected using multiplexer 410 to control the CE 455 input of storage block 430.

Storage block 430 also has a preset function, which is controlled by a preset (PR) signal 475. PR 475 enables presetting of storage block 430 to a high or "one." PR 475 may be selected from nine different signals using a nine-to-one multiplexer 480, also controlled by user-programmable SRAM bits. PR 475 may be programmably connected to ground or VSS to permanently disable the preset feature of storage block 430. Furthermore, PR 475 may be programmably connected to one of the four primary inputs 410 or the complements of the four primary inputs 410. One of these nine signals may be programmably selected using multiplexer 480 to control the PR 475 input of storage block 430.

An LEOUT 485 signal is an output of LE 300. LEOUT 485 may be a combinatorial or registered output, which is programmably selected using a two-to-one multiplexer 487, also controlled by user-programmable SRAM bits. There are two inputs to multiplexer 487, output 407 of multiplexer 405 and the Q 437 output of storage block 430. For a combinatorial output, multiplexer 487 is programmed to select output 407 of multiplexer 487 for LEOUT 485. For a registered or sequential output, multiplexer 487 is programmed to select the Q 437 output of storage block 430 for LEOUT 485.

LEOUT 485 is programmably connected to local interconnect structure 310 of FIG. 3. Through local interconnect structure 310, and without using the global interconnect structure, LEOUT 485 is programmably connectable to other LEs 300 within the same LAB 200. An example of a use of output feedback to other LEs is to create a six-input function generator by using five four-input LEs 300: Four LEs 300 feedback to local interconnect structure 310 to programmably couple to a fifth LE 300 (in which four inputs will be utilized). As this example illustrates, the local interconnect structure 310 facilitates the building of these more complex logical functions requiring multiple LABs. Furthermore, LEOUT 485 is programmably connectable to the global interconnect structure, GHs 210 and GVs 220, for connection to other LABs 200.

In the embodiment shown in FIG. 4, secondary logic block 350 has three inputs. A first input is connected to the output of multiplexer 470, which is the same control signal as CLR 465 (described above). A second input is connected to the output of multiplexer 480, which is the same control signal as PR 475 (described above). A third input is connected to output 407 of multiplexer 405, which selects an output from LUT 400. Like the CLR 465 and PR 475 signals, the first and second inputs, respectively, to secondary logic block 350 are programmably selected from nine possible signals: the four primary inputs 410, the complements of the four primary inputs 410, and ground.

Secondary logic block 350 has an output 490 for outputting data. Data is output using a registered data path of LE 300. More specifically, output 490 is coupled to multiplexer 425. Multiplexer 425 programmably couples output 490 to input 436 of storage block 430. Then, data from secondary logic block 350 is clocked or latched into storage block 430 as described earlier. From storage block 430, data is output through Q 437 and multiplexer 487 to LEOUT 485.

From LEOUT 485, output from secondary logic block 350 may be programmably coupled to local interconnect 310 for programmably coupling to other LEs 300 of LAB 200. From LEOUT 485, output from secondary logic block 350 also may be programmably coupled to the global interconnect structure, GHs 210 and GVs 220, for programmably coupling to other LABs 200.

Diagnostic shadow latch 435 is a latch for storing data. Diagnostic shadow latch 435 is especially useful for prototyping, debugging, and diagnosing ill-behaved logical functions and sequential machines programmed into a PLD. Diagnostic shadow latch 435 is generally not used during the normal operation of a PLD.

The operations of diagnostic shadow latch 435 are governed by control signal 428, the same control signal controlling multiplexer 425. Diagnostic shadow latch 435 is coupled to various components of LE 300, for loading or retrieving data from these components. Diagnostic shadow latch 435 is coupled to the WDATA or WNDATA lines of LUT 400. Via WDATA and WNDATA, diagnostic shadow latch 435 can program LUT 400 with a particular function or "view" the contents of LUT 400.

Diagnostic shadow latch 435 is also coupled through multiplexer 425 to input 436 of storage block 430 and output 437 of storage block 430. Diagnostic shadow latch 435 may be used to "capture" the contents of storage block 430. More specifically, through the Q 437 output, the contents of storage block 430 may be latched into diagnostic shadow latch 435. Diagnostic shadow latch 435 may also be used to write data into storage block 430. More specifically, diagnostic shadow latch 435 can load data through multiplexer 425 and input 436 into storage block 430.

These paths to diagnostic shadow latch 435 provide a user of LE 300 the ability to check the contents of various LE components at a user-selectable time. For example, LE 300 is often used to implement a sequential machine with many different states. In this situation, a user can use diagnostic shadow latch 435 to load storage block 430 with data to place the sequential machine in a particular state. Then, the user exercises LE 300 according to a test sequence. In the end, diagnostic shadow latch 435 is used to retrieve the contents of storage block 430 to determine whether LE 300 operated correctly and generated the proper output. Moreover, a user may use diagnostic shadow latch 435 to view the contents of storage block 430 after each and every step of the sequential machine.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. In a programmable logic device, a logic element comprising:
    a look-up table for implementing logical functions coupled to a multiplexer;
    a storage block, coupled to said look-up table, wherein said storage block stores an output of said look-up table;
    a first plurality of inputs, programmably coupled to said multiplexer and programmably coupled to said storage block;
    a second plurality of inputs, programmably coupled to said storage block, wherein said second plurality of inputs are complements of said first plurality of inputs;
    a combinatorial output, coupled to said look-up table; and
    a registered output, coupled to said storage block.

2. In a programmable logic device, a logic element comprising:
    a look-up table for implementing logical functions coupled to a multiplexer;
    a storage block, programmably coupled to said look-up table, wherein said storage block stores an output of said look-up table, wherein said storage block comprises clock enable, clear, preset, and clock inputs;
    a first plurality of inputs, programmably coupled to said multiplexer and programmably coupled to said clock enable, clear, preset, and clock inputs; and
    a second plurality of inputs, programmably coupled to said clock enable, clear, preset, and clock inputs, wherein said second plurality of inputs are complements of said first plurality of inputs;
    a combinatorial output, coupled to said look-up table; and
    a registered output, coupled to said storage block.

3. A logic element for a programmable logic device comprising:
    a programmable function generator for implementing logical functions; and
    a programmable delay block, coupled to said programmable function generator, wherein said programmable delay block programmably delays an output from said programmable function generator.

4. The logic element of claim 3 further comprising:
    a storage block for storing said output from said programmable function generator, wherein said delay block is coupled between said programmable function generator and said storage block, wherein said programmable delay block programmably delays a signal passed from said programmable function generator to said storage block.

5. The logic element of claim 4 further comprising:
    a multiplexer, coupled between said delay block and said storage block, wherein said multiplexer selectively couples said delay block to said storage block.

6. The logic element of claim 5 wherein said multiplexer selectively couples a secondary logic block to said storage block, wherein a path from said secondary logic block through said multiplexer to said storage block does not pass through said programmable delay block.

7. The logic element of claim 6 wherein said multiplexer selectively couples a diagnostic shadow latch to said storage block, wherein a path from said diagnostic shadow latch through said multiplexer to said storage block does not pass through said programmable delay block.

8. The logic element of claim 4 further comprising:
    a multiplexer, wherein said multiplexer selectively couples said programmable function generator to an output of said logic element, wherein an output path from said programmable function generator to said multiplexer does not pass through said programmable delay block.

9. The logic element of claim 8 wherein said multiplexer selectively couples said storage block to an output of said logic element, wherein an output path from said storage block to said multiplexer does not pass through said programmable delay block.

10. A logic element for a programmable logic device comprising:
- a programmable function generator for implementing logical functions;
- a diagnostic shadow latch, coupled to a configuration loading pin of said programmable function generator, wherein said diagnostic shadow latch stores and provides diagnostic data; and
- a storage block coupled to an output of said programmable function generator and to said diagnostic shadow latch.

11. A logic element in a programmable logic device comprising:
- a programmable function generator for implementing logical functions;
- a diagnostic shadow latch, coupled to a plurality of configuration loading pins of said programmable function generator, wherein said diagnostic shadow latch stores and provides diagnostic data; and
- a storage block, coupled to said programmable function generator, wherein said storage block stores an output of said programmable function generator, wherein said diagnostic shadow latch is coupled to an input of said storage block and an output of said storage block.

12. A logic element for a programmable logic device comprising:
- a programmable function generator for implementing logical functions;
- a storage block, coupled to said programmable function generator, said storage block for storing said output from said programmable function generator; and
- a diagnostic shadow latch, coupled to an input of said storage block and an output of said storage block, wherein said diagnostic shadow latch stores and provides diagnostic data.

13. The logic element of claim 12 further comprising:
- a multiplexer, coupled between said programmable function generator and said storage block and coupled between said diagnostic shadow latch and said storage block, wherein said multiplexer selectively couples said programmable function generator and said diagnostic shadow latch to said storage block.

14. The logic element of claim 13 further comprising:
- a plurality of control inputs, coupled to control said multiplexer and said diagnostic shadow latch.

15. A logic element for a programmable logic device comprising:
- a programmable function generator for implementing logical functions;
- a secondary logic block, coupled to said programmable function generator, wherein said secondary logic block implements logical functions; and
- a storage block, coupled to said programmable function generator and said secondary logic block, wherein said storage block selectively stores an output from said programmable function generator or an output from said secondary logic block.

16. The logic element of claim 15 further comprising:
- a diagnostic shadow latch, coupled to said storage block, wherein said storage block selectively stores an output from said diagnostic shadow latch.

17. A logic element for a programmable logic device comprising:
- a programmable function generator for implementing logical functions;
- a secondary logic block, coupled to said programmable function generator, wherein said secondary logic block implements logical functions;
- a first plurality of inputs, coupled to said programmable function generator and said secondary logic block; and
- a second plurality of inputs, coupled to said secondary logic block, wherein said second plurality of inputs are complements of said first plurality of inputs.

18. The logic element of claim 17 further comprising:
- a storage block, coupled to selectively store an output of said programmable function generator or an output of said secondary logic block;
- wherein a selected one of said first plurality of inputs controls a preset input of said storage block and said secondary logic block; and
- wherein a selected one of said second plurality of inputs controls said preset input of said storage block and said secondary logic block, wherein said second plurality of inputs are complements of said first plurality of inputs.

19. The logic element of claim 17 further comprising:
- a storage block, coupled to selectively store an output of said programmable function generator and an output of said secondary logic block;
- wherein a selected one of said first plurality of inputs controls a clear input of said storage block and said secondary logic block; and
- wherein a selected one of said second plurality of inputs controls said clear input of said storage block and said secondary logic block, wherein said second plurality of inputs are complements of said first plurality of inputs.

20. A logic element for a programmable logic device, comprising:
- a programmable function generator for implementing logical functions;
- a secondary logic block, coupled to said programmable function generator, wherein said secondary logic block implements logical functions; and
- a storage block, coupled to said programmable function generator and said secondary logic block, said storage block selectively stores an output from said programmable function generator or an output from said secondary logic block, wherein an output of said secondary logic block may be programmably coupled through said storage block to an output of said logic element.

21. A logic element for a programmable logic device, comprising:
- a programmable function generator for implementing logical functions;
- a secondary logic block, coupled to said programmable function generator, wherein said secondary logic block implements logical functions; and
- a storage block, coupled to said programmable function generator and said secondary logic block, said storage block selectively stores an output from said programmable function generator or an output from said secondary logic block, wherein said programmable function generator is coupled to said secondary logic block via a direct path, not passing through said storage block.

22. A system comprising a programmable logic device having a logic element as recited in claim 3.

23. A logic element for a programmable logic device comprising:

a look-up table for implementing logical functions;

a storage block, coupled to said look-up table, said storage block storing an output from said look-up table, said storage block programmable configurable as a latch in a first mode, wherein said latch is responsive to a level-sensitive input, said storage block programmable configurable as a register in a second mode, wherein said register is responsive to an edge-triggered input;

a combinatorial output, coupled to said look-up table;

a registered output, coupled to said storage block; and a programmable delay block, coupled between said look-up table and said storage block, said programmable delay block for programmably delaying a signal passed from said look-up table to said storage block.

24. A logic element for a programmable logic device comprising:

a look-up table for implementing logical functions;

a storage block, coupled to said look-up table, said storage block storing an output from said look-up table, said storage block programmable configurable as a latch in a first mode, wherein said latch is responsive to a level-sensitive input, said storage block programmable configurable as a register in a second mode, wherein said register is responsive to an edge-triggered input;

a combinatorial output, coupled to said look-up table;

a registered output, coupled to said storage block;

a first plurality of inputs, programmably coupled to control said look-up table and a control input of said storage block; and a second plurality of inputs, programmably coupled to control said control input of said storage block, wherein said second plurality of inputs are complements of said first plurality of inputs.

25. The logic element of claim 24, wherein the control input is a preset input of said storage block.

26. The logic element of claim 24, wherein the control input is a clock enable input of said storage block.

27. The logic element of claim 24, wherein the control input is a clock input of said storage block.

28. The logic element of claim 27 further comprising:

a first plurality of clock inputs, programmably coupled to said clock input of said storage block; and a second plurality of clock inputs, programmably coupled to said clock input of said storage block, wherein said second plurality of clock inputs are complements of said first plurality of clock inputs.

29. The logic element of claim 24, wherein the control input is a clock input of said storage block.

30. A logic element for a programmable logic device comprising:

a look-up table for implementing logical functions:

a storage block, coupled to said look-up table, said storage block storing an output from said look-up table, said storage block programmably configurable as a latch in a first mode, wherein said latch is responsive to a level-sensitive input, said storage block programmable configurable as a register in a second mode, wherein said register is responsive to an edge-triggered input;

a combinatorial output, coupled to said look-up table;

a registered output, coupled to said storage block; and a diagnostic shadow latch, coupled to said look-up table and said storage block, wherein said diagnostic shadow latch stores and provides diagnostic data.

31. A logic element for a programmable logic device comprising:

a look-up table for implementing logical functions;

a storage block, coupled to said look-up table, said storage block storing an output from said look-up table, said storage block programmable configurable as a latch in a first mode, wherein said latch is responsive to a level-sensitive input, said storage block programmable configurable as a register in a second mode, wherein said register is responsive to an edge-triggered input;

a combinatorial output, coupled to said look-up table;

a registered output, coupled to said storage block; and a diagnostic shadow latch, coupled to an input of said storage block and an output of said storage block, wherein said diagnostic shadow latch stores and provides diagnostic data.

32. A logic element for a programmable logic device comprising:

a look-up table for implementing logical functions;

a storage block, coupled to said look-up table, said storage block storing an output from said look-up table, said storage block programmably configurable as a latch in a first mode, wherein said latch is responsive to a level-sensitive input, said storage block programmable configurable as a register in a second mode, wherein said register is responsive to an edge-triggered input;

a combinatorial output, coupled to said look-up table;

a registered output, coupled to said storage block; and a diagnostic shadow latch, coupled to a plurality of configuration loading pins for said look-up table, wherein said diagnostic shadow latch stores and provides diagnostic data.

* * * * *

UNITED STATES PATENT AND TRADEMARK OFFICE
CERTIFICATE OF CORRECTION

PATENT NO. : 5,821,773
DATED : October 13, 1998
INVENTOR(S) : KEVIN A. NORMAN et al.

It is certified that error appears in the above-identified patent and that said Letters Patent is hereby corrected as shown below:

Column 15, claim 23, lines 4 and 6, change "programmable" to --programmably--.

Column 15, claim 24, lines 21 and 23, change "programmable" to --programmably--.

Column 16, claim 30, line 8, change "programmable" to --programmably--.

Column 16, claim 31, lines 21 and 23, change "programmable" to --programmably--.

Column 16, claim 32, line 40, change "programmable" to --programmably--.

Signed and Sealed this

Twenty-third Day of March, 1999

Attest:

Q. TODD DICKINSON

Attesting Officer

Acting Commissioner of Patents and Trademarks